US009568750B2

(12) United States Patent
Spann et al.

(10) Patent No.: US 9,568,750 B2
(45) Date of Patent: Feb. 14, 2017

(54) HYBRID OPTICAL MODULATOR

(71) Applicant: Skorpios Technologies, Inc., Albuquerque, NM (US)

(72) Inventors: John Y. Spann, Albuquerque, NM (US); Derek Van Orden, Albuquerque, NM (US); Amit Mizrahi, Albuquerque, NM (US); Timothy Creazzo, Albuquerque, NM (US); Elton Marchena, Albuquerque, NM (US); Robert J. Stone, Berkeley, CA (US); Stephen B. Krasulick, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 732 days.

(21) Appl. No.: 13/861,564

(22) Filed: Apr. 12, 2013

(65) Prior Publication Data

US 2013/0301975 A1   Nov. 14, 2013

Related U.S. Application Data

(60) Provisional application No. 61/624,099, filed on Apr. 13, 2012.

(51) Int. Cl.
*G02F 1/035* (2006.01)
*G02F 1/025* (2006.01)
(Continued)

(52) U.S. Cl.
CPC ............. *G02F 1/025* (2013.01); *G02F 1/2257* (2013.01); *H01L 21/02538* (2013.01);
(Continued)

(58) Field of Classification Search
None
See application file for complete search history.

(56) References Cited

U.S. PATENT DOCUMENTS 5,442,205 A * 8/1995 Brasen .............. H01L 21/02381
257/12
7,747,122 B2   6/2010 Shetrit et al.
(Continued)

FOREIGN PATENT DOCUMENTS

WO   WO 2013/155378 A1   10/2013

OTHER PUBLICATIONS

IPRP mailed on Oct. 23, 2014, for International Patent Application PCT/US2013/036313 filed on Apr. 12, 2013, all pages.
(Continued)

*Primary Examiner* — Chad Smith
(74) *Attorney, Agent, or Firm* — Kilpatrick Townsend & Stockton LLP

(57) ABSTRACT

An optical modulator includes an input port, a first waveguide region comprising silicon and optically coupled to the input port, and a waveguide splitter optically coupled to the first waveguide region and having a first output and a second output. The optical modulator also includes a first phase adjustment section optically coupled to the first output and comprising a first III-V diode and a second phase adjustment section optically coupled to the second output and comprising a second III-V diode. The optical modulator further includes a waveguide coupler optically coupled to the first phase adjustment section and the second phase adjustment section, a second waveguide region comprising silicon and optically coupled to the waveguide coupler, and an output port optically coupled to the second waveguide region.

16 Claims, 7 Drawing Sheets

(51) Int. Cl.
  *H01L 21/02* (2006.01)
  *H01L 29/20* (2006.01)
  *G02F 1/225* (2006.01)

(52) U.S. Cl.
  CPC ........ *H01L 29/20* (2013.01); *G02F 2202/102* (2013.01); *G02F 2202/105* (2013.01)

(56) References Cited

U.S. PATENT DOCUMENTS

| | | |
|---|---|---|
| 2002/0071621 A1 | 6/2002 | Yamada |
| 2004/0037500 A1* | 2/2004 | Yoo .................... G02B 6/12004 385/31 |
| 2006/0008223 A1 | 1/2006 | Gunn, III et al. |
| 2006/0105508 A1 | 5/2006 | Zia et al. |
| 2010/0039650 A1 | 2/2010 | Molin et al. |
| 2010/0060970 A1 | 3/2010 | Chen |
| 2010/0231817 A1 | 9/2010 | Ide et al. |
| 2010/0266232 A1 | 10/2010 | Lipson et al. |
| 2010/0290732 A1 | 11/2010 | Gill |
| 2010/0296766 A1 | 11/2010 | Ishibashi et al. |
| 2010/0303476 A1 | 12/2010 | Barton et al. |
| 2011/0064351 A1* | 3/2011 | Kise ...................... G02F 1/0121 385/3 |
| 2011/0073989 A1 | 3/2011 | Rong et al. |
| 2011/0091148 A1 | 4/2011 | Li |
| 2011/0267676 A1 | 11/2011 | Dallesasse et al. |
| 2012/0033910 A1* | 2/2012 | Morini .................... G02F 1/025 385/3 |

OTHER PUBLICATIONS

Notification of Transmittal of the International Search Report and The Written Opinion of the International Searching Authority, or The Declaration and International Search Report and Written Opinion of the International Searching Authority for International Application No. PCT/US2013/036313 mailed on Jul. 25, 2013, 11 pages.

* cited by examiner

HYBRID OPTICAL MODULATOR

CROSS-REFERENCES TO RELATED APPLICATIONS

This application claims priority to U.S. Provisional Patent Application No. 61/624,099, filed on Apr. 13, 2012, entitled "Hybrid Optical Modulator," the disclosure of which is hereby incorporated by reference in its entirety for all purposes.

BACKGROUND OF THE INVENTION

High speed modulators are utilized in communications systems to modulate signals, for example, digital signals. High speed modulators using, for example, Mach Zehnder interferometer designs, have been implemented in lithium niobate and InP as discrete components that are utilized in conjunction with discrete optical elements.

Current high speed modulators suffer from a variety of performance limitations. These include the need for a high drive voltage, which, in turn, results in high power consumption. Additionally, conventional high speed modulators occupy a large footprint, reducing device yield and increasing device cost. Moreover, integration with other optical systems can result in high insertion loss, which adversely impacts system performance.

Thus, there is a need in the art for improved methods and systems related to high speed modulators.

SUMMARY OF THE INVENTION

Embodiments of the present invention relate to optical systems. More particularly, embodiments of the present invention relate to the fabrication of a hybrid optical modulator, for example, using a template assisted bonding process. In a particular embodiment, a hybrid optical modulator utilizes silicon waveguide sections integrated with III-V diodes operable to introduce phase delay in the arms of a Mach Zehnder interferometer.

According to an embodiment of the present invention, a hybrid diode structure is provided. The hybrid diode structure includes a substrate comprising silicon material and an insulating layer coupled to the substrate. The hybrid diode structure also includes a III-V diode coupled to the insulating layer and having an n-type region and a p-type region and a first electrical contact electrically coupled to the n-type region. The hybrid diode structure further includes a second insulating layer overlying the III-V diode material and a second electrical contact electrically coupled to the p-type region.

According to another embodiment of the present invention, an optical modulator is provided. The optical modulator includes an input port, a first waveguide region comprising silicon and optically coupled to the input port, and a waveguide splitter optically coupled to the first waveguide region and having a first output and a second output. The optical modulator also includes a first phase adjustment section optically coupled to the first output and comprising a first III-V diode and a second phase adjustment section optically coupled to the second output and comprising a second III-V diode. The optical modulator further includes a waveguide coupler optically coupled to the first phase adjustment section and the second phase adjustment section, a second waveguide region comprising silicon and optically coupled to the waveguide coupler, and an output port optically coupled to the second waveguide region.

According to a specific embodiment of the present invention, a method of fabricating a hybrid diode structure is provided. The method includes providing a substrate having a silicon substrate, an insulating layer coupled to the silicon substrate, and a silicon waveguide disposed in the insulating layer. The method also includes bonding a III-V diode to the insulating layer. The III-V diode includes an n-type region and a p-type region. The method further includes forming a second insulating layer coupled to the III-V diode and the insulating layer, forming an electrical contact to the n-type region, and forming an electrical contact to the p-type region.

According to a particular embodiment of the present invention, a hybrid diode structure is provided. The hybrid diode structure includes a substrate comprising silicon material and an insulating layer coupled to the substrate. The insulating layer comprises a central portion having a first thickness and a lateral portion having a second thickness less than the first thickness. The hybrid diode structure also includes a bonding region (e.g., including Ti, Pt, or In) coupled to the lateral portion of the insulating layer, a bottom contact region coupled to the lateral portion of the insulating layer, and a III-V diode material (e.g., InGaAsP) coupled to the insulating layer. The III-V diode material comprises a propagation region adjacent the central portion of the insulating layer and a bias region adjacent to the lateral portion of the insulating layer. The hybrid diode structure further includes a second insulating layer overlying the III-V diode material, a III-V conductive element passing through the second insulating layer, and an electrical contact electrically coupled to the III-V conductive element.

In an implementation, the bottom contact region can include a P+ contact and the hybrid diode structure can also include an N+ contact electrically coupled to the bias region of the III-V diode material.

According to another particular embodiment of the present invention, an optical modulator is provided. The optical modulator includes an input port, a first waveguide region optically coupled to the input port, and a waveguide splitter (e.g., a multi-mode interference device, a directional coupler, or a Y-junction coupler) optically coupled to the first waveguide region and having a first output and a second output. The waveguide splitter can be a 3 dB directional coupler. The optical modulator also includes a first phase adjustment section optically coupled to the first output and comprising a first hybrid diode and a second phase adjustment section optically coupled to the second output and comprising a second hybrid diode. The optical modulator further includes a waveguide coupler (e.g., a multi-mode interference device, a directional coupler, or a Y-junction coupler) optically coupled to the first phase adjustment section and the second phase adjustment section, a second waveguide region optically coupled to the waveguide coupler, and an output input port optically coupled to the second waveguide region. The waveguide coupler can be a 3 dB directional coupler.

According to yet another particular embodiment of the present invention, a method of fabricating a diode is provided. The method includes providing a substrate having a silicon-containing layer and an insulating layer coupled to the silicon-containing layer, removing a portion of the insulating layer, and forming one or more bonding regions (e.g., Ti/Pt/In) coupled to a remaining portion of the insulating layer. The method also includes bonding III-V diode material to the one or more bonding regions, removing a portion of the III-V diode material, and forming a first electrical contact (e.g., an n-type contact) to a remaining portion of the III-V diode material. The method further includes forming a second insulating layer coupled to the III-V diode material and forming a second electrical contact (e.g., a p-type contact) to the III-V diode material. The second insulating layer can be a CVD dielectric or a spin on glass (SOG).

The substrate can be an SOI substrate and the III-V diode materials can be InGaAsP-based. In an embodiment, the portion of the III-V diode material comprises lateral portions and the portion of the III-V diode material comprises a portion of a p-type material.

In an embodiment, a hybrid diode structure includes a substrate comprising silicon material and an insulating layer coupled to the substrate. The insulating layer comprises a central portion having a first thickness and a lateral portion having a second thickness less than the first thickness and a bonding region coupled to the lateral portion of the insulating layer. The hybrid diode structures also includes a bottom contact region coupled to the lateral portion of the insulating layer and a III-V diode material coupled to the insulating layer. The III-V diode material comprises a propagation region adjacent the central portion of the insulating layer and a bias region adjacent the lateral portion of the insulating layer. The hybrid diode structure further includes a second insulating layer overlying the III-V diode material, a III-V conductive element passing through the second insulating layer, and an electrical contact electrically coupled to the III-V conductive element.

Numerous benefits are achieved by way of the present invention over conventional techniques. For example, embodiments of the present invention provide a high performance, low drive voltage, low insertion loss, as well as compatibility with high volume production in a CMOS fabrication facility. These and other embodiments of the invention along with many of its advantages and features are described in more detail in conjunction with the text below and attached figures.

DETAILED DESCRIPTION OF SPECIFIC EMBODIMENTS

The inventors have determined that pure silicon modulators suffer from bandwidth limitations, large size, high drive power, and high insertion loss. On the contrary, III-V modulators exhibit higher bandwidth and higher performance than silicon modulators. Although embodiments of the present invention are discussed in terms of Mach-Zehnder modulator (either phase or amplitude modulation) applications, the hybrid diode structure described herein is not limited to these applications, but can also be utilized in other applications including ring modulators, disk modulators, tuning elements based on phase shift, phase bias elements, or other types of phase shifting devices.

Embodiments of the present invention provide a high-performance hybrid Si/III-V modulator based on a template assisted bonding (TAB) process. The III-V materials are disposed on a low index material, as well as surrounded by low index materials in some implementations.

High-performance is facilitated by the strong mode confinement provided by the low index materials utilized in the design. This gives a performance that is even higher than pure (i.e., monolithically integrated) III-V modulators. Additionally, as described below, a top hat design (pedestal for the metal contact) is used in some implementations, which keeps the contact from interfering with the optical mode, and thus reduces the modulator insertion loss. In addition, bonding is performed at a significant distance from the optical mode to reduce or minimize optical losses. Utilizing the TAB process, it is possible to fabricate a hybrid modulator that is compatible with high volume CMOS fabrication processes, opening up opportunities for device integration and leveraging existing CMOS designs and processes. In a particular embodiment, the III-V diodes bonded using the TAB process are utilized in a Mach-Zehnder configuration.

Figure 1A:
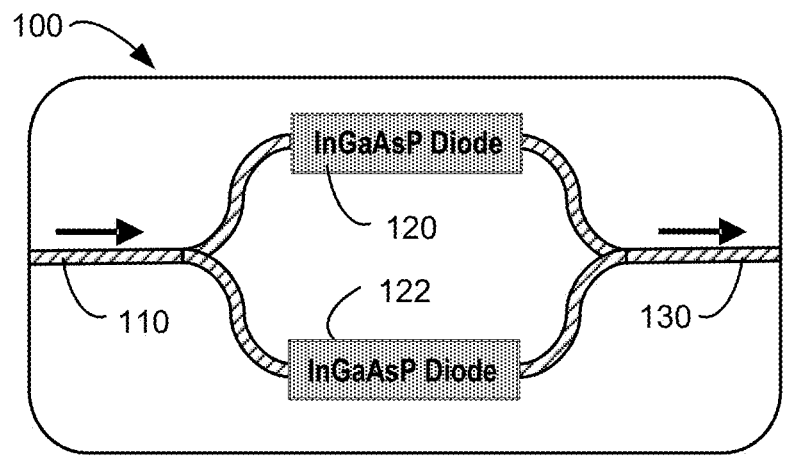
FIG. 1A is schematic diagram illustrating a hybrid optical modulator according to an embodiment of the present invention.

FIG. 1A is schematic diagram illustrating a hybrid optical modulator according to an embodiment of the present invention. As illustrated in FIG. 1A, the hybrid optical modulator 100 receives input light at silicon waveguide 110 and utilizes waveguide splitters to direct light from the optical input through a set of III-V (e.g., InGaAsP) diodes 120 and 122. After transmission through the set of III-V diodes, the light is recombined by a waveguide coupler to provide an optical output through silicon waveguide 130.

The embodiment illustrated in FIG. 1A utilizes the performance characteristics provided by silicon waveguides in combination with those of III-V diodes in an integrated hybrid configuration, enabling a high efficiency modulator on a silicon platform. The III-V diode enjoys the high performance properties associated with III-V materials, including high mobility, and the like, providing fast and responsive devices. At the same time, the silicon waveguides are characterized by low optical losses (i.e., low total losses). In monolithic III-V designs in which the waveguides utilize III-V materials, the active regions of the waveguide are also present in the waveguide sections, resulting in high optical losses in the waveguide sections. By separating the waveguiding and phase adjustment functions into optimized materials, embodiments of the present invention provide benefits not available using monolithic (i.e., monolithically integrated) designs.

Figure 1B:
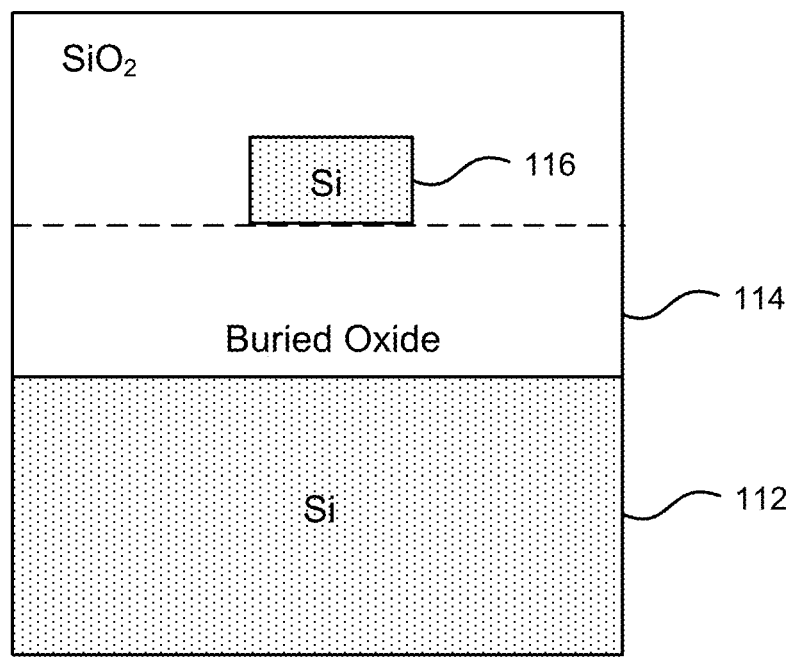
FIG. 1B is a schematic diagram illustrating a cross-section of a silicon waveguide according to an embodiment of the present invention.

FIG. 1B is a simplified cross-sectional view of a silicon waveguide suitable for use as waveguides 110 and 130 shown in FIG. 1A. A silicon-on-insulator (SOI) structure is used as the substrate material and includes silicon substrate 112, which can be a single crystal substrate. The buried oxide layer 114 of the SOI substrate is present below the silicon waveguide 116, which is fabricated from the single crystal layer of the SOI substrate. After definition of the waveguide, additional insulating material (e.g., $SiO_2$) is deposited to cover the sides and the top of the waveguide. In an embodiment, the lateral width of the silicon waveguide 116 is 400 nm and the vertical height is 220 nm although other dimensions can be utilized. As will be evident to one of skill in the art, the dimensions of the silicon waveguide structure can be modified to provide for low optical loss as the optical mode couples from the silicon waveguide to the III-V diode.

Although coupling between the silicon waveguide and the waveguide region of the III-V diode is accomplished in some embodiments by positioning the silicon waveguide and the III-V diode waveguides at the same height with respect to the SOI layers (e.g., the SOI substrate), this is not required by the present invention and other coupling methods can be utilized. In some embodiments, the optical coupling between the silicon waveguide and the core of the III-V diode can be implemented while the silicon waveguide and the core of the III-V diode are at different heights, with tapered optical couplers transferring the optical signal vertically to provide for high coupling efficiency for cores present at different heights. Additional description related to integrated waveguide couplers is provided in commonly assigned U.S. patent application Ser. No. 13/597,117, entitled "Integrated Waveguide Coupler," and filed on Aug. 28, 2012, the disclosure of which is hereby incorporated by reference in its entirety for all purposes. One of ordinary skill in the art would recognize many variations, modifications, and alternatives.

Figure 2A:
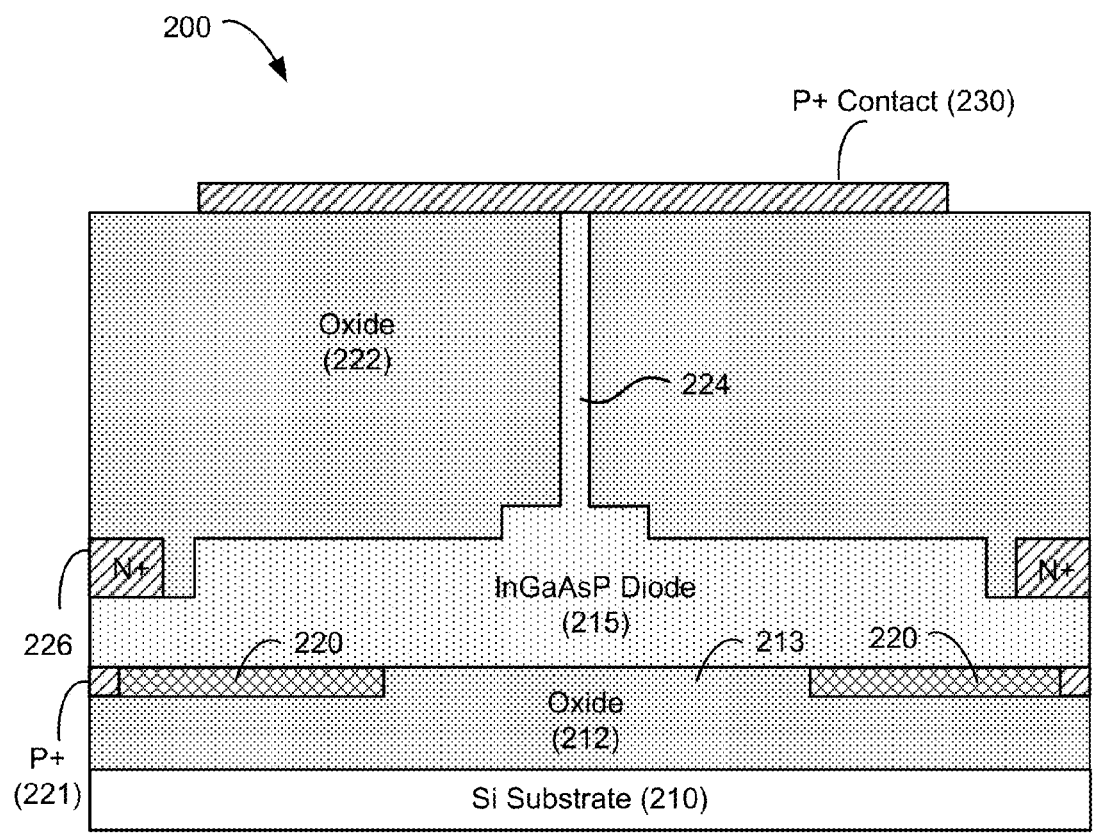
FIG. 2A is a schematic diagram illustrating a cross-section of a III-V diode structure of a hybrid optical modulator according to an embodiment of the present invention.

FIG. 2A is a schematic diagram illustrating a III-V diode structure of a hybrid optical modulator according to an embodiment of the present invention. The structure illustrated in FIG. 2A represents one of the III-V (e.g., InGaAsP) diodes 120/122 illustrated in FIG. 1. The optical mode propagates into the plane of FIG. 2A.

Referring to FIG. 2A, a silicon substrate 210 is provided. In some implementations, the silicon substrate is a support substrate of a silicon-on-insulator (SOI) structure in which the single crystal silicon layer above the buried oxide has been removed. A buried oxide layer 212 (which may be the insulator layer of the SOI structure) is coupled to the silicon substrate. The buried oxide layer is patterned and etched (or other suitable removal process) to form an extension region 213 that is adjacent to recessed areas 220, which can also be referred to as bonding regions. Utilizing a bonding process, for example, a Template Assisted Bonding (TAB) process, metallization (e.g., $In_{0.7}Pd_{0.3}$) is formed in recessed areas 220 to connect to the p-type layer at the bottom of the InGaAsP diode and bottom P+ contacts 221 are deposited on the buried oxide layer 212 so that they are coupled to the buried oxide layer. Electrical contact to the bottom P+ contacts and the N+ contacts is provided through electrical connections (not shown), for example, vias passing through the insulating layer 222. Electrical contact and bonding of III-V materials to the layers of the SOI substrate can be performed independent of the TAB process.

In order to provide bonding regions for the III-V diode material, bonding regions are formed, for example, by depositing and/or patterning a metal stack (e.g., Ti/Pt/In). Although this particular bonding material is illustrated, embodiments of the present invention are not limited to this example and other materials suitable for forming bonding contacts can be utilized. Additional description related to the TAB process is provided in co-pending and commonly assigned U.S. patent application Ser. No. 13/112,142, filed on May 20, 2011, the disclosure of which is hereby incorporated by reference in its entirety for all purposes. Typically, the III-V diode bottom p-type layer contacts the oxide layer, but is not necessarily bonded to the oxide layer, with bonding accomplished through the metallization formed in the recessed areas 220. In other embodiments, direct bonding of the III-V diode to the insulating layer (i.e., oxide 212) is performed. It should be noted that contacts to both p-type materials and n-type materials can be provided through vias (not shown) passing through the insulating layer 222 and/or located to the sides of the portions of the III-V diode illustrated in FIG. 2A, obviating the need for the InGaAsP or InP fin 224 discussed below.

As illustrated in FIG. 2A, the pedestal 213 formed by the buried oxide near the center of the diode enables lateral spatial separation between the optical mode and the bonding regions and bottom P+ contacts, reducing optical losses. Embodiments of the present invention provide benefits not available using monolithic III-V designs since the InGaAsP diode 215 is coupled to the buried oxide layer 212 of the SOI substrate, providing an index difference between the core and cladding materials not available using only III-V materials. As will be evident to one of skill in the art, for monolithic designs, the refractive index of InP used as the cladding material is on the order of ~3.17, providing only a small index difference between the cladding and the InGaAsP core (refractive index of ~3.3). In contrast, utilizing embodiments of the present invention, the index difference is much greater since the cladding includes the buried oxide with a refractive index of ~1.46. The large index contrast resulting from the hybrid integration enables the diodes in the modulator to be much more efficient (e.g., higher phase shift per voltage) than can be achieved using conventional monolithically integrated III-V designs.

The hybrid optical modulator also includes a III-V diode material with a bandgap (e.g., 1.0 eV) larger than the wavelength of light propagating through the modulator (e.g., 0.8 eV). In the example illustrated in FIG. 2A, the III-V diode material is InGaAsP with a bandgap of approximately 1.0 eV, but other III-V materials are suitable for use depending on the particular applications, for example, InP, InGaAs, or the like. One of ordinary skill in the art would recognize many variations, modifications, and alternatives.

Additionally, the III-V diode material provides larger index of refraction changes near the wavelengths of interest than silicon diodes. As discussed above, use of metal bonding techniques or direct bonding techniques, which may include use of the TAB process in some embodiments, enables the use of a high index III-V material in conjunction with the low index insulating layer (e.g., the buried oxide), providing a high level of optical mode confinement.

As illustrated in FIG. 2A, portions of the III-V diode material is removed (e.g., the lateral edges) to pattern the diode material as appropriate to the particular applications. In the illustrated example, the upper portions of the InGaAsP material are p-doped, the middle portions are n-doped, and the lower portions are p-doped. Thus, to access the n-type material for the N+ contact, upper portions of the InGaAsP material are removed on the lateral edges to expose the n-type material and facilitate electrical contact.

N+ contacts (e.g., aluminum) are formed in electrical communication with the n-type layers in the III-V diode material, enabling the injection of current into the InGaAsP material in response to application of a voltage bias between the N+ and P+ contacts. Accordingly, depletion (or injection) of carriers in the diode junction is provided in response to bias. As the carrier concentrations in the diode structure are modified, phase modulation is provided as appropriate for a modulator.

An insulating layer 222 (e.g., oxide) is formed above the III-V diode 215, providing electrical and optical isolation. Additionally, a top hat design (pedestal for the top P+ metal contact 230) is used in some implementations, which reduces the impact of the electrical contact on the optical mode. As illustrated in FIG. 2A, an InGaAsP or InP rod or fin 224 extends vertically from the diode region to the top metal contact 23 and is fabricated as part of the original InGaAsP structure that is bonded to the substrate using the TAB process in some embodiments. In some embodiments, the fin 224 extends into the plane of the image and has a length along the propagation direction substantially equal to the length of the diode. Although a rod or fin shape extending into the plane of the figure is illustrated, other suitable shapes are included within the scope of the present invention. Additionally, other materials can be utilized such as InP materials. Thus, some embodiments of the present invention utilize a monolithic InGaAsP or InP pedestal (e.g., fin 224) that serves to separate the top P+ metal contact 230 from the optical mode, thereby reducing optical losses. Below fin 224, the InGaAsP diode 215 includes a ridge guide as well as active regions as described more fully below.

The fabrication of the InGaAsP diode 215 can include epitaxial growth of the various layers, including the layers adjacent oxide 212, etching or use of another removal process to define the fin 224 and the ridge guide, as well as removal of portions of the p-type layers to access the n-type layers for N+ contacts 226. After the N+ contacts are formed, the oxide 222 is blanket deposited. The oxide pedestal 213 between metal contacts in the recessed areas 220 is typically a small fraction of the width of the III-V diode, for example, 10 µm in width for a III-V diode with a width of 100-300 µm. It should be noted that typically, the actual diode is small, but the piece of bonded epitaxial material is much larger. The oxide pedestal provides a cladding for the optical mode in the diode waveguide with the majority of the bond interface being with the metal materials, reducing the impact of differing lattice mismatch, differing coefficients of thermal expansion, and the like.

Figure 2B:
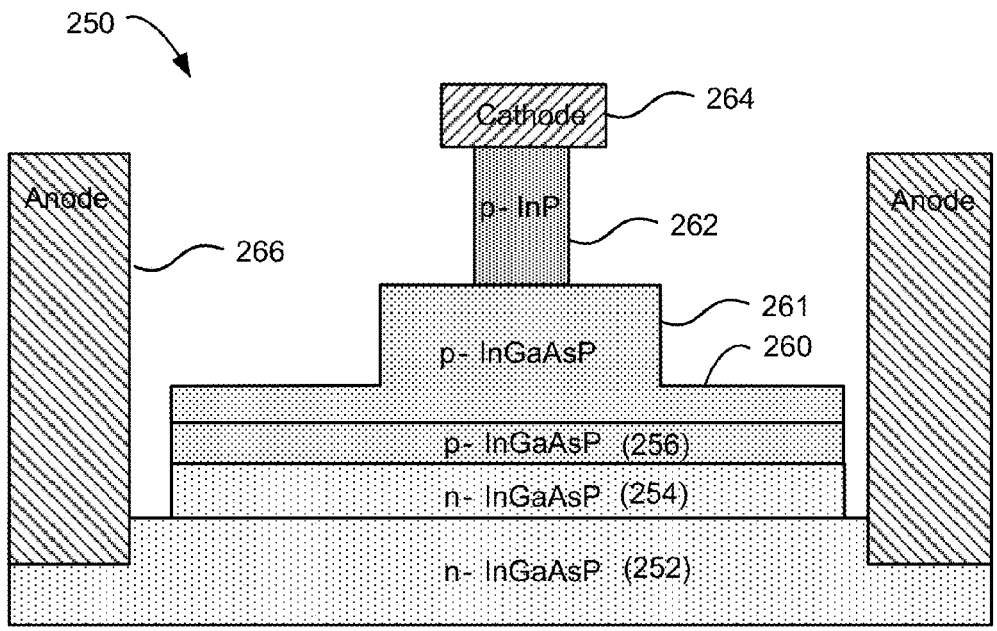
FIG. 2B is a schematic diagram illustrating a cross-section of a III-V diode structure of a hybrid optical modulator according to another embodiment of the present invention.
Figure 3A:
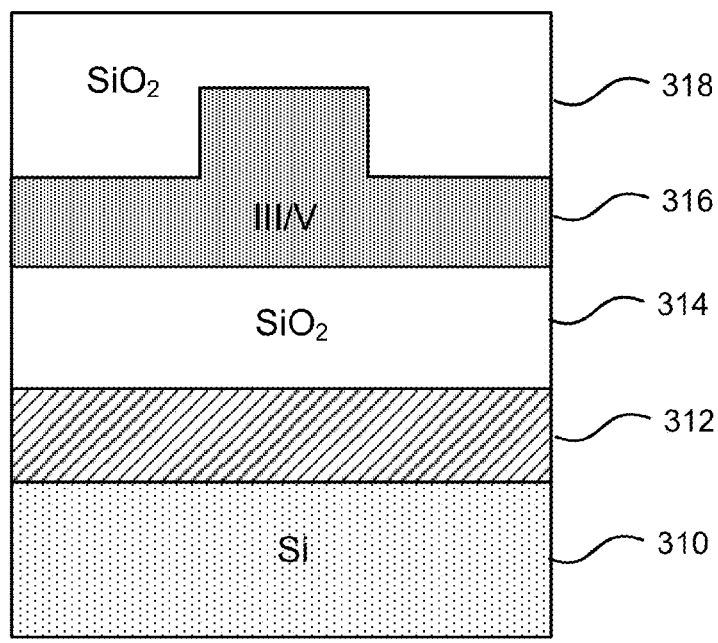
FIGS. 3A and 3B are schematic diagrams illustrating bonding configurations according to embodiments of the present invention.

In some embodiments, rather than using an oxide pedestal, an oxide stripe can be deposited and patterned on the III-V material of the diode after epitaxial growth. Referring to FIG. 3A, a bonding metal 312 is formed on the surface of the silicon substrate 310. The oxide (e.g., silicon dioxide) layer 314 is deposited on the III-V diode 316 before bonding. Subsequently, the oxide stripe 314 is then bonded to the bonding metal layer 312. In these embodiments, the metal contacts are thus formed between the silicon substrate 310 and the deposited oxide stripe 314. Typically, contacts are formed as illustrated in relation to FIG. 2B.

Figure 3B:
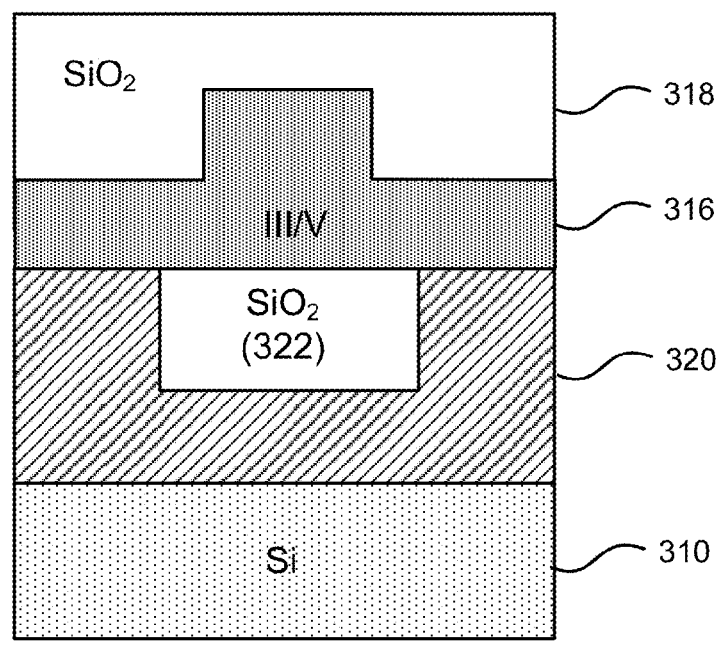

In the embodiment illustrated in FIG. 3B, an oxide stripe 322 is embedded in bonding metal 320, with the bond interface between the III-V diode 316 including both regions bonded to the bonding metal 320 as well as regions bonded to the oxide stripe 322. The oxide stripe 322 can be deposited as a layer on the bottom of the III-V diode and then patterned to provide the optical cladding for the III-V diode waveguide. In some embodiments, the interface between the oxide stripe 322 is not a chemical bond, but merely physical contact. Blanket oxide 318 is illustrated in both figures.

In the InGaAsP diode illustrated in FIG. 2A, a P-i-N-i-P diode structure is utilized, but this is not required by the present invention. FIG. 2B illustrates a P-N diode structure that can be utilized in other embodiments, which is bonded to the SOI substrate, for example, the buried oxide layer of the SOI substrate. The InGaAsP diode 250 includes a plurality of epitaxial layers including an 80 nm thick n-InGaAsP layer 252 doped at $1 \times 10^{18}$ cm$^{-3}$ that serves as a heavily doped n-type contact layer to the anode 266. The diode also includes a 30 nm thick n-InGaAsP layer 254 doped at $1 \times 10^{17}$ cm$^{-3}$ and a 30 nm thick p-InGaAsP layer 256 doped at $1 \times 10^{17}$ cm$^{-3}$. The diode further includes a 20 nm thick p-InGaAsP layer 260 doped at $1 \times 10^{18}$ cm$^{-3}$ and a 60 nm thick n-InGaAsP pedestal 261 doped at $1 \times 10^{18}$ cm$^{-3}$. In an embodiment, the lateral width of the pedestal is 560 nm. In order to spatially separate the P-N junction from the cathode 264, a vertical extension fin 262 of p-InP doped at $1.5 \times 10^{18}$ cm$^{-3}$ 450 nm thick (measured vertically) and 150 nm in lateral width is provided. The InP/InGaAsP structure is typically grown in a single growth run and then patterned as illustrated after bonding to the SOI substrate including the silicon waveguides. Typical lateral spacing between the anodes and cathode is on the order of microns, for example, a lateral spacing of 1.5 µm between the cathode and the anodes. Although the configuration illustrated in FIG. 2B, and other figures illustrated herein, is p-up, this is not required by embodiments of the present invention and bonding could be performed in a p-down configuration as well. One of ordinary skill in the art would recognize many variations, modifications, and alternatives.

Figure 2C:
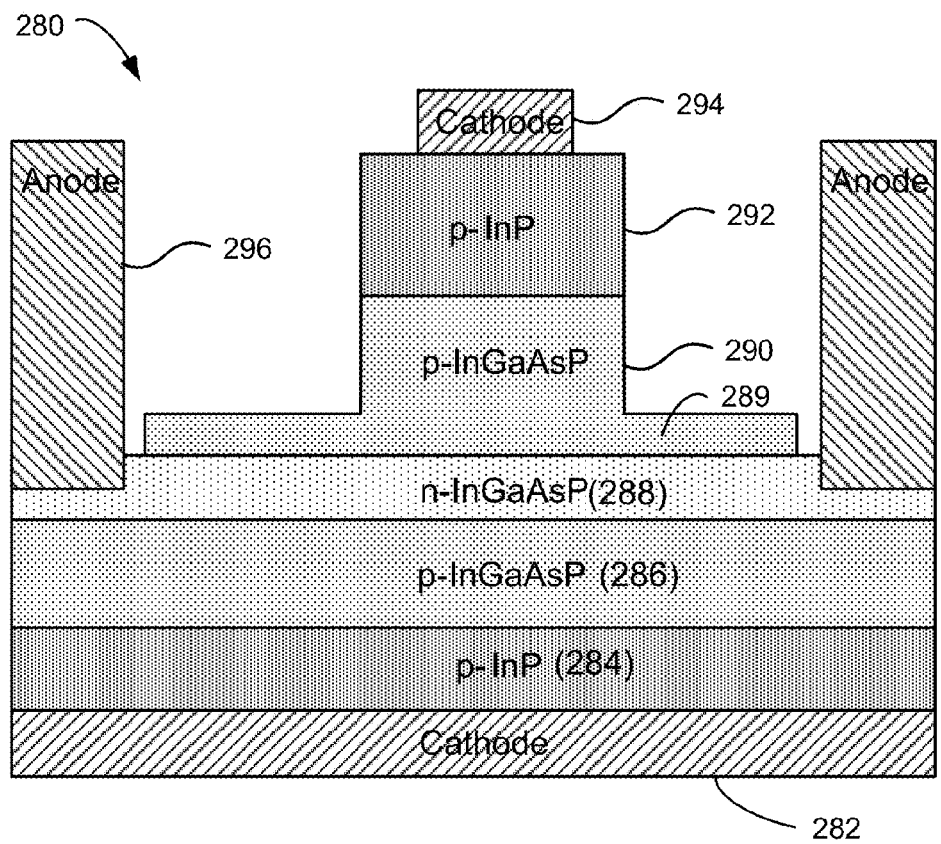
FIG. 2C is a schematic diagram illustrating an InGaAsP diode structure according to an alternative embodiment of the present invention.

FIG. 2C is a simplified schematic diagram illustrating an InGaAsP diode structure according to an alternative embodiment of the present invention. Although InGaAsP layers are illustrated in FIG. 2C, the invention is not limited to these particular quaternary materials and other III-V structures are included within the scope of the present invention. The III-V diode material can thus include layers of InGaAsP in which the mole fractions of at least In, Ga, As, or P range from zero to one. In the embodiment illustrated in FIG. 2C the InGaAsP diode 280 includes a 2.0 µm thick p-InP layer 284 doped at $1.5 \times 10^{18}$ cm$^{-3}$ that serves as a contact layer to the cathode 28. The first P-N junction is formed by a 275 nm thick p-InGaAsP layer 286 doped at $7.5 \times 10^{17}$ cm$^{-3}$ and a 280 nm thick n-InGaAsP layer 288 doped at $1.5 \times 10^{18}$ cm$^{-3}$. The anodes 296 are electrically connected to the n-InGaAsP layer 288. Another P-N junction is formed between n-InGaAsP layer 288 and a p-InGaAsP structure including a 110 nm thick layer 289 and a 385 nm thick pedestal 290. The contact element includes a p-InP element 292 doped at $1.5 \times 10^{18}$ cm$^{-3}$, 650 nm thick and 1.4 µm in width. Although contact element 292 is illustrated as the same width as the ridge portion 290 of p-InGaAsP structure, this is not required by the present invention and the contact element can be thinner as discussed in relation to fin 224 in FIG. 2A.

In the illustrated embodiment, the lateral spacing between the anodes 296 and cathode 294 is on the order of microns (e.g., 2 µm) although other dimensions can be utilized.

As illustrated in FIG. 2C, this diode structure does not include a bottom oxide layer and is thicker than the diode structure illustrated in FIG. 2B. Additionally, the P-N-P diode design utilizes both bottom and top cathodes. The diode could also utilize a P-i-N-i-P structure. Due to the thicker design, the SOI substrate to which the diode structure is bonded is modified in a corresponding manner, with a 1.5 µm thick silicon waveguide structure buried in oxide with a lateral width of 2.0 µm. Additionally, an MMI coupler is utilized rather than Y-junctions in the Mach-Zehnder modulator structure. One of ordinary skill in the art would recognize many variations, modifications, and alternatives.

As shown in FIGS. 2A-2C, versions of a 1.0 eV InGaAsP depletion mode modulator are illustrated, and can be modeled by computing the changes in refractive index and absorption loss as a function of voltage bias. As an example, modeling parameters used in relation to a specific device were a waveguide width of 560 nm and a waveguide height of 210 nm. The pedestal formed by the buried oxide layer had a width of 100 nm and a height of 300 nm. Other device dimensions are included within the scope of the present invention and these values are used merely by way of example.

Figure 4:
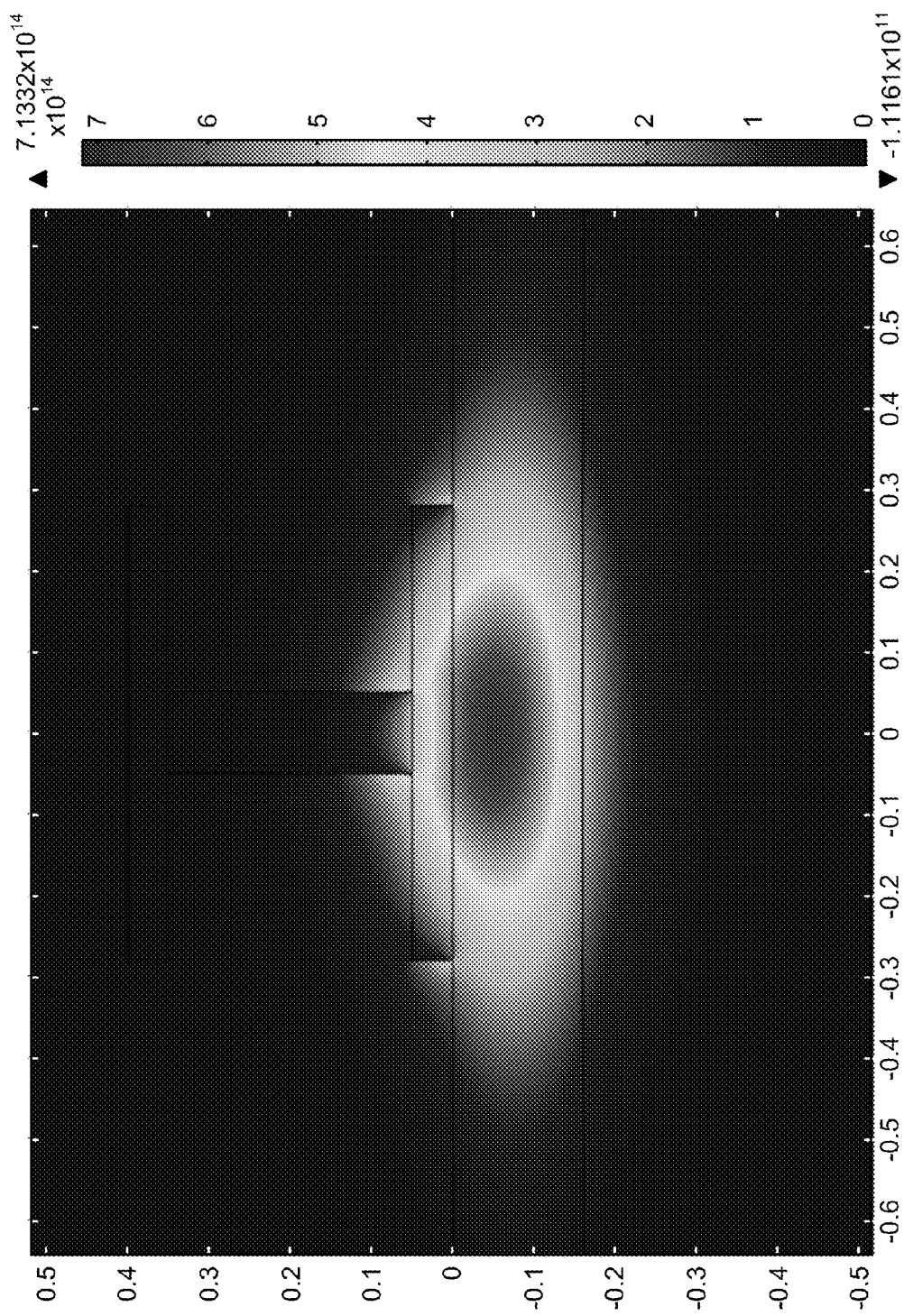
FIG. 4 is a plot illustrating modal properties of the III-V diode structure according to an embodiment of the present invention.

For the device and model illustrated in FIGS. 2A and 4, a voltage of Vpp-1.2 V and a reverse bias of 0.9±0.6 V were utilized. For a diode length of 180 µm, insertion loss was 1.8 dB and the index of refraction was n=2.577323. Switching between bias points was achieved with $\Delta n=0.00435$, $\Delta loss=0.16$ dB.

FIG. 4 is a plot illustrating modal properties of the III-V diode structure according to an embodiment of the present invention. As illustrated in FIG. 4, the effective mode index was $2.577+j\ 2.258\times10^{-4}$ with substantial mode confinement. The optical mode is confined by a ridge guide (e.g., ridge 261 illustrated in FIG. 2B). Optical coupling of the mode to the silicon waveguides is discussed herein and can be accomplished by utilizing epitaxial layers that will vertically align the mode in the III-V diode with the mode in the silicon waveguide. Referring to FIGS. 1B and 2A, silicon layer 112 corresponds to silicon substrate 210, both layers being the silicon substrate of the SOI structure. As discussed herein, the optical losses of the silicon waveguide are reduced in comparison to what the optical losses would be if the P-N junction materials of the III-V diode were present in a monolithically integrated waveguide fabricated from the same III-V diode materials. One of ordinary skill in the art would recognize many variations, modifications, and alternatives.

Figure 5:
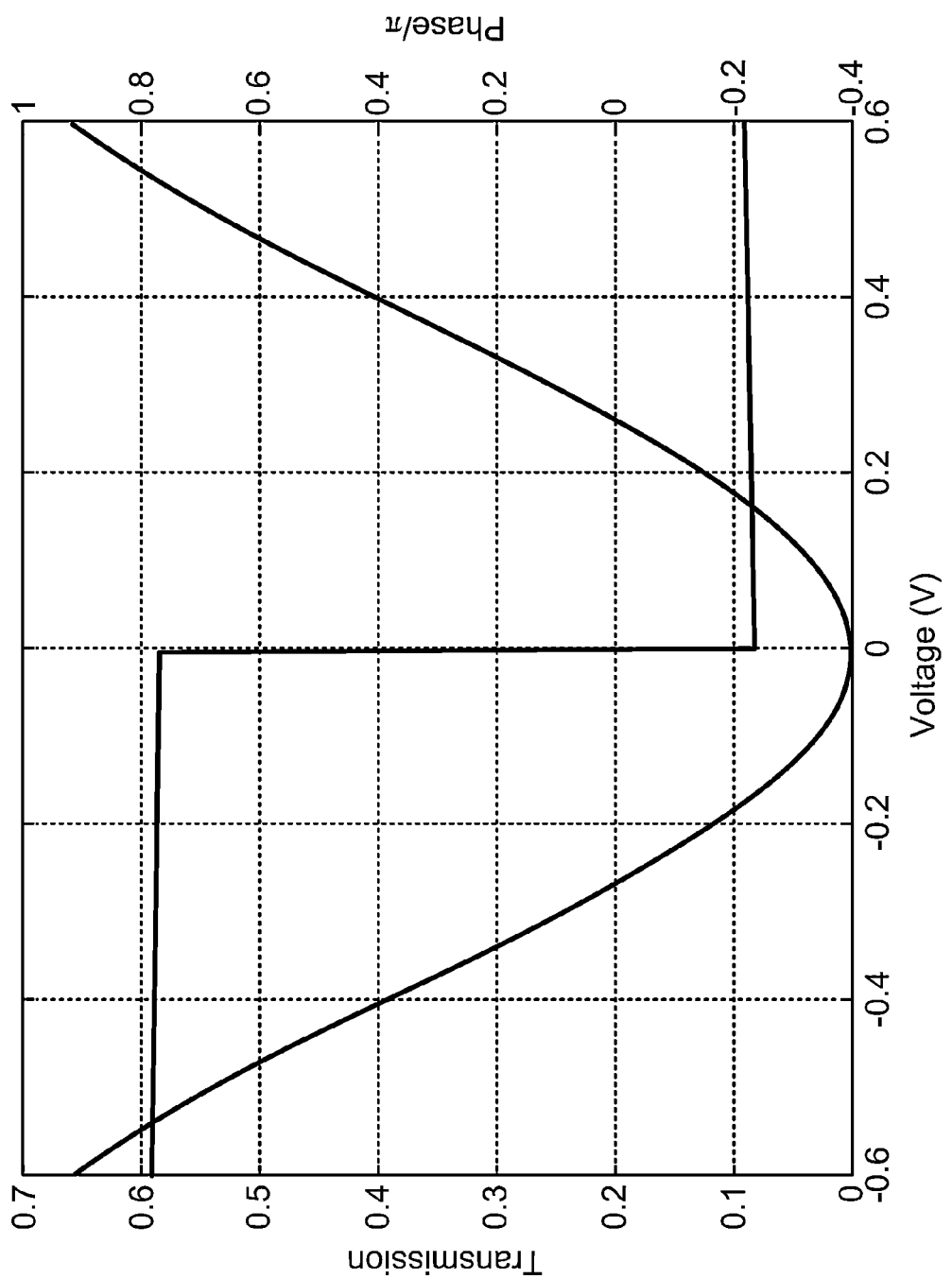
FIG. 5 is a plot illustrating transmission and phase as a function of voltage for the III-V diode structure according to an embodiment of the present invention.

FIG. 5 is a plot illustrating transmission (parabolic curve) and phase (stair step) as a function of voltage for the III-V diode MZI structure driven differentially according to an embodiment of the present invention. The transmission drops from about 0.65 to about zero as the applied voltage decreases from about −0.6 V to zero volts. Increasing the voltage to 0.6 V returns the transmission to about 0.65. The phase is substantially constant as the voltage is ramped from −0.6 V to zero and then from zero to 0.6 V (with a π phase shift over the whole voltage swing). The MZI structure can be driven in multiple ways to achieve the desired modulation, for example, amplitude or phase modulation.

Figure 6:
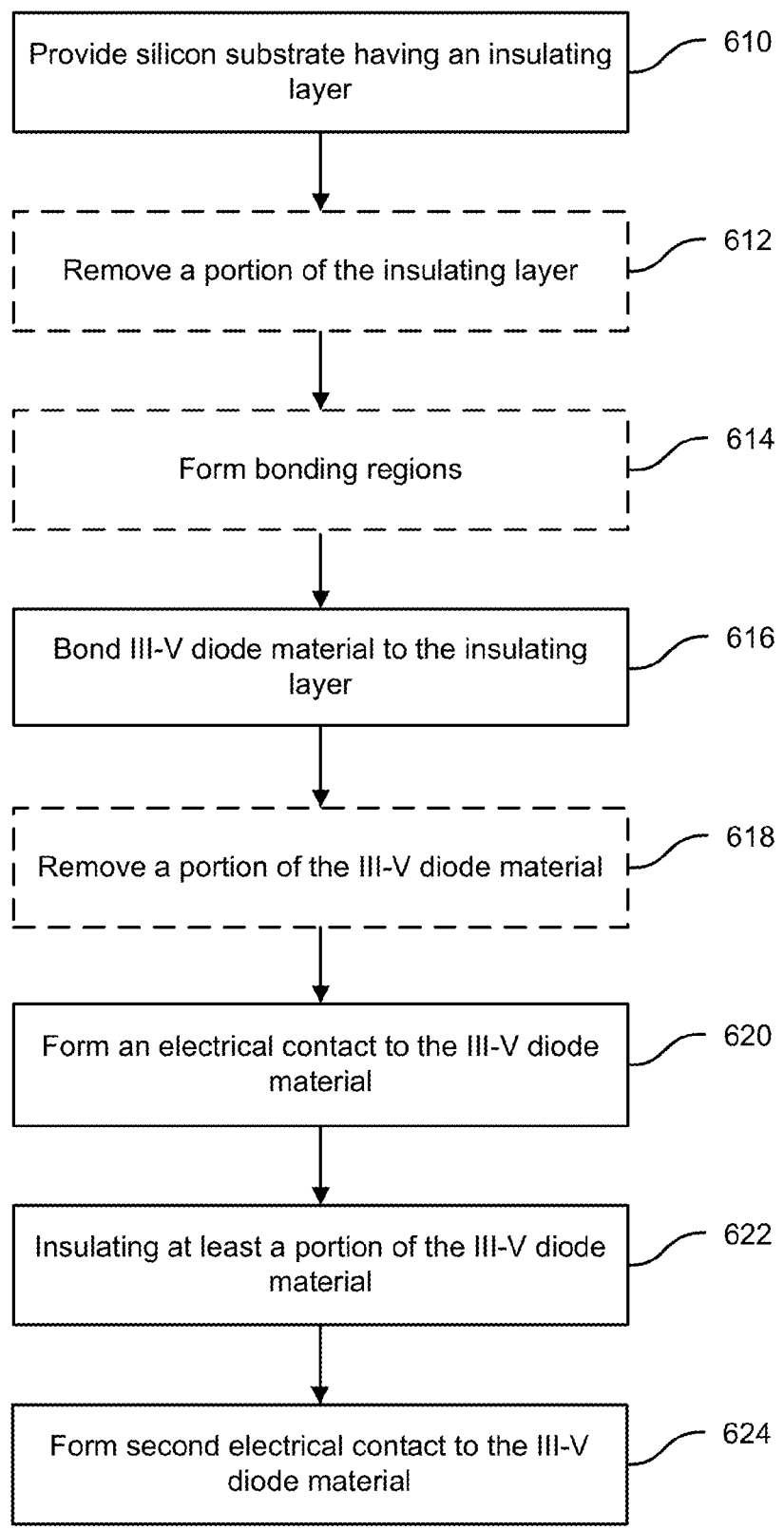
FIG. 6 is a simplified flowchart illustrating a method of fabricating a hybrid optical modulator according to an embodiment of the present invention.

FIG. 6 is a simplified flowchart illustrating a method of fabricating a diode according to an embodiment of the present invention. The method includes providing a substrate having a silicon-containing layer and an insulating layer coupled to the silicon-containing layer. In an embodiment, the substrate is part of an SOI wafer with one of the silicon layers removed. The method may include removing a portion of the insulating layer and forming one or more bonding regions (e.g., Ti/Pt/In) coupled to a remaining portion of the insulating layer.

The method also includes bonding III-V diode material (e.g., InGaAsP) to the one or more bonding regions, removing a portion of the III-V diode material, and forming a first electrical contact (e.g., an N+ contact) to a remaining portion of the III-V diode material. In an embodiment, the lateral portions of the upper epitaxial layers (e.g., p-type layers) of III-V diode material are removed to expose n-type layers of the III-V diode material. Additionally, the method includes forming a second insulating layer coupled to the III-V diode material and forming a second electrical contact (e.g., a P+ contact) to the III-V diode material. The second insulating layer can be a CVD dielectric, an SOG, combinations thereof, or the like.

In some embodiments, the portion of the III-V diode material comprises a portion of a p-type material, the first electrical contact comprises an n-type contact, the second insulating layer comprises at least one of a CVD dielectric or SOG, or the second electrical contact comprises a p-type contact. The bonding regions can utilize Ti/Pt/In or other suitable metals or alloys. The portion of the III-V diode material can include lateral portions.

According to another embodiment of the present invention, a method of fabricating a hybrid diode structure includes providing a substrate having a silicon substrate, an insulating layer coupled to the silicon substrate, and a silicon waveguide disposed in the insulating layer. The method also includes bonding a III-V diode to the insulating layer. The III-V die includes an n-type region and a p-type region. The method further includes forming a second insulating layer coupled to the III-V diode and the insulating layer, forming an electrical contact to the n-type region, and forming an electrical contact to the p-type region.

It should be appreciated that the specific steps illustrated in FIG. 6 provide a particular method of fabricating a diode according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A hybrid diode structure comprising:
   a substrate comprising single crystal silicon material;
   a buried oxide layer directly overlying and coupled to the substrate;
   a III-V diode, directly overlying and coupled to the oxide layer, and having an n-type region and a p-type region, wherein the p-type region is of a width and a height sufficient to create substantial mode confinement for an optical mode propagating therethrough;
   a first electrical contact electrically coupled to the n-type region;
   a second oxide layer directly overlying the III-V diode;
   a III-V conductive element passing through the second oxide layer and electrically coupled to the p-type region, wherein the III-V conductive element is reduced in width from the width of the p-type region such that optical losses are reduced by separating the second electrical contact from the optical mode; and
   a second electrical contact electrically coupled to the p-type region;

wherein the optical mode propagates through a ridge portion of the p-type region:
from a first silicon waveguide section that comprises a single crystal silicon layer overlying the buried oxide layer and underlying the second oxide layer;
to a second silicon waveguide section that comprises a single crystal silicon layer overlying the buried oxide layer and underlying the second oxide layer; and
the III-V conductive element couples with the p-type region along substantially an entire length of the ridge portion of the p-type region along a direction of light propagation from the first silicon waveguide section to the second silicon waveguide section.

2. The hybrid diode structure of claim 1 wherein the first electrical contact passes through the second oxide layer.

3. The hybrid diode structure of claim 1 wherein the buried oxide layer comprises a central portion having a first thickness and a lateral portion having a second thickness less than the first thickness.

4. The hybrid diode structure of claim 3 wherein the III-V diode material comprises a propagation region adjacent the central portion of the buried oxide layer and a bias region adjacent the lateral portion of the buried oxide layer.

5. The hybrid diode structure of claim 4 further comprising an N+ contact electrically coupled to the bias region of the III-V diode material.

6. The hybrid diode structure of claim 3, wherein a bonding region coupled with the lateral portion of the oxide layer comprises at least one of Ti, Pt, or In.

7. The hybrid diode structure of claim 1 wherein the substrate comprises one or more silicon waveguide sections that are directly optically coupled to the III-V diode, each of the one or more silicon waveguide sections comprising a single crystal silicon layer overlying the buried oxide layer and underlying the second oxide layer.

8. The hybrid diode structure of claim 1 wherein a bottom contact region of the III-V diode comprises a P+ contact.

9. The hybrid diode structure of claim 1 wherein a cathode of the III-V diode is disposed between the p-type region and the substrate.

10. The hybrid diode structure of claim 1, wherein a single epitaxial growth provides material of the p-type region and the III-V conductive element, and wherein the width of the p-type region and the reduced width of the III-V conductive element are formed by removing part of the epitaxial growth.

11. An optical modulator comprising:
a single crystal silicon substrate;
a buried oxide layer directly overlying the single crystal silicon substrate;
an input port;
a first waveguide comprising a single crystal silicon layer overlying the buried oxide layer, the first waveguide being directly optically coupled to the input port;
a waveguide splitter that is directly optically coupled to the first waveguide and having a first output and a second output;
a first phase adjustment section that is directly optically coupled to the first output and comprising a first III-V diode overlying the buried oxide layer;
a second phase adjustment section that is directly optically coupled to the second output and comprising a second III-V diode directly overlying the buried oxide layer;
a waveguide coupler that optically couples optical signals from the first phase adjustment section and the second phase adjustment section into a waveguide coupler output;
a second waveguide comprising a single crystal silicon layer overlying the buried oxide layer, the second waveguide being directly optically coupled to the waveguide coupler output; and
an output port that is directly optically coupled to the second waveguide.

12. The optical modulator of claim 11 wherein the first III-V diode and the second III-V diode comprise InGaAsP diodes.

13. The optical modulator of claim 11 wherein the waveguide splitter comprises at least one of a multi-mode interference device, a directional coupler, or a Y-junction coupler.

14. The optical modulator of claim 11 wherein at least one of the waveguide splitter or the waveguide coupler comprises a 3 dB directional coupler.

15. The optical modulator of claim 11 wherein the waveguide coupler comprises at least one of a multi-mode interference device, a directional coupler, or a Y-junction coupler.

16. The optical modulator of claim 11, wherein:
the first III-V diode includes a first oxide layer and a first III-V propagation region adjacent a central portion of the first oxide layer, the first III-V propagation region having a width and a height sufficient to create substantial mode confinement for an optical mode propagating therethrough, the first III-V propagation region being directly optically coupled to the first output; and
the second III-V diode includes a second oxide layer and a second III-V propagation region adjacent a central portion of the second oxide layer, the second III-V propagation region having a width and a height sufficient to create substantial mode confinement for an optical mode propagating therethrough, the second III-V propagation region being directly optically coupled to the second output.

* * * * *